(12) United States Patent
Birner et al.

(10) Patent No.: US 9,875,933 B2
(45) Date of Patent: Jan. 23, 2018

(54) SUBSTRATE AND METHOD INCLUDING FORMING A VIA COMPRISING A CONDUCTIVE LINER LAYER AND CONDUCTIVE PLUG HAVING DIFFERENT MICROSTRUCTURES

(71) Applicant: Infineon Technologies AG, Neubiberg (DE)

(72) Inventors: Albert Birner, Regensburg (DE); Tobias Herzig, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/192,146

(22) Filed: Jun. 24, 2016

(65) Prior Publication Data

US 2017/0372952 A1    Dec. 28, 2017

(51) Int. Cl.
| | | |
|---|---|---|
| H01L 21/768 | (2006.01) | |
| H01L 21/288 | (2006.01) | |
| H01L 23/48 | (2006.01) | |
| H01L 23/522 | (2006.01) | |
| H01L 23/528 | (2006.01) | |
| H01L 23/532 | (2006.01) | |

(52) U.S. Cl.
CPC .... *H01L 21/76879* (2013.01); *H01L 21/2885* (2013.01); *H01L 21/7682* (2013.01); *H01L 21/7685* (2013.01); *H01L 21/76834* (2013.01); *H01L 21/76898* (2013.01); *H01L 23/481* (2013.01); *H01L 23/5226* (2013.01); *H01L 23/5283* (2013.01); *H01L 23/53228* (2013.01); *H01L 23/53238* (2013.01)

(58) Field of Classification Search
None
See application file for complete search history.

(56) References Cited

U.S. PATENT DOCUMENTS

| | | | |
|---|---|---|---|
| 5,252,848 | A | 10/1993 | Adler et al. |
| 6,048,772 | A | 4/2000 | D'Anna |
| 7,119,399 | B2 | 10/2006 | Ma et al. |
| 7,221,034 | B2 | 5/2007 | Ma et al. |
| 7,253,492 | B2 | 8/2007 | Ma et al. |
| 7,456,094 | B2 | 11/2008 | Ma et al. |
| 7,626,233 | B2 | 12/2009 | Tornblad et al. |
| 7,772,123 | B2 | 8/2010 | Birner et al. |
| 8,227,340 | B2 | 7/2012 | Seidel et al. |
| 8,399,936 | B2 | 3/2013 | Birner et al. |

(Continued)

FOREIGN PATENT DOCUMENTS

DE    10348641 A1    5/2005

OTHER PUBLICATIONS

Sunitha, et al., "Reduced Surface Field Technology for LDMOS: A Review", International Journal of Emerging Technology and Advanced Engineering, vol. 4, Issue 6, Jun. 2014, pp. 173-176.

*Primary Examiner* — Jay C Chang
(74) *Attorney, Agent, or Firm* — Murphy, Bilak & Homiller, PLLC

(57) ABSTRACT

In an embodiment, a substrate includes semiconductor material and a conductive via. The conductive via includes a via in the substrate, a conductive plug filling a first portion of the via and a conductive liner layer that lines side walls of a second portion of the via and is electrically coupled to the conductive plug. The conductive liner layer and the conductive plug have different microstructures.

10 Claims, 5 Drawing Sheets

(56) References Cited

U.S. PATENT DOCUMENTS

| | | |
|---|---|---|
| 8,518,764 B2 | 8/2013 | Dao et al. |
| 8,680,615 B2 | 3/2014 | Mitra et al. |
| 8,716,791 B1 | 5/2014 | Iravani et al. |
| 8,890,324 B2 | 11/2014 | Dao |
| 9,064,712 B2 | 6/2015 | Sanders et al. |
| 9,165,918 B1 | 10/2015 | Yang et al. |
| 9,245,952 B2 | 1/2016 | Yao et al. |
| 2002/0038891 A1 | 4/2002 | Ryu et al. |
| 2004/0229456 A1 | 11/2004 | Andricacos et al. |
| 2006/0046350 A1 | 3/2006 | Jiang et al. |
| 2006/0289924 A1 | 12/2006 | Wang |
| 2008/0093641 A1 | 4/2008 | Ludikhuize et al. |
| 2008/0119007 A1 | 5/2008 | Raghuram et al. |
| 2008/0166849 A1 | 7/2008 | Yang et al. |
| 2009/0294849 A1 | 12/2009 | Min et al. |
| 2009/0302480 A1* | 12/2009 | Birner ............... H01L 21/76898 257/774 |
| 2010/0022084 A1 | 1/2010 | Chen et al. |
| 2010/0032756 A1 | 2/2010 | Pendharkar et al. |
| 2010/0230818 A1 | 9/2010 | Birner et al. |
| 2010/0295154 A1 | 11/2010 | Riess |
| 2011/0074040 A1* | 3/2011 | Frank ................... H01L 21/288 257/774 |
| 2011/0101425 A1 | 5/2011 | Grote et al. |
| 2011/0309442 A1 | 12/2011 | Grote et al. |
| 2012/0037969 A1 | 2/2012 | Sanders et al. |
| 2012/0061758 A1 | 3/2012 | Khan et al. |
| 2012/0061798 A1* | 3/2012 | Wong ................ H01L 27/10861 257/532 |
| 2013/0119547 A1 | 5/2013 | Kim et al. |
| 2014/0225186 A1 | 8/2014 | Abou-Khalil et al. |
| 2015/0243583 A1 | 8/2015 | Li et al. |
| 2015/0251382 A1 | 9/2015 | Terasaki et al. |
| 2015/0294898 A1 | 10/2015 | Yamaguchi |
| 2016/0141362 A1 | 5/2016 | Gogoi |

\* cited by examiner

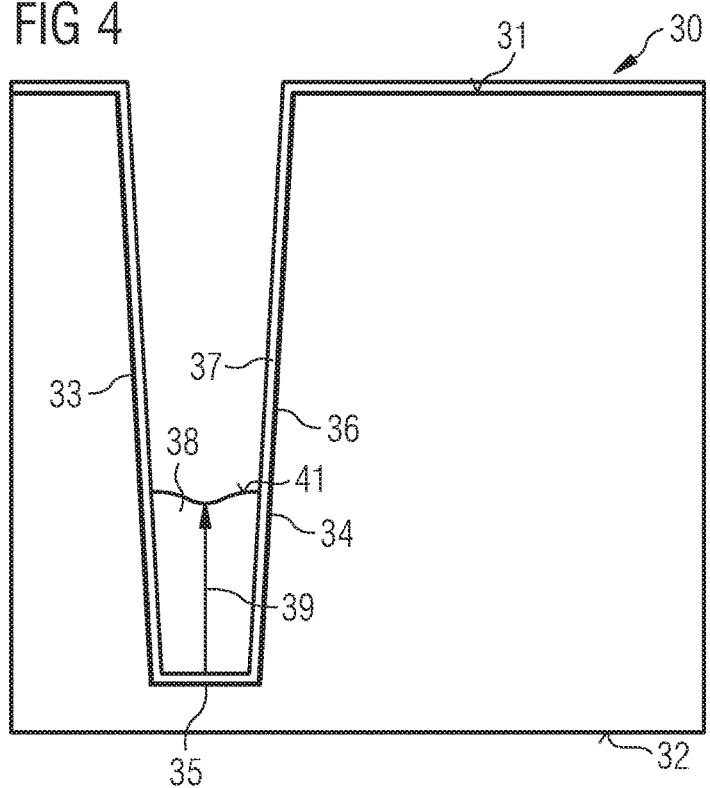
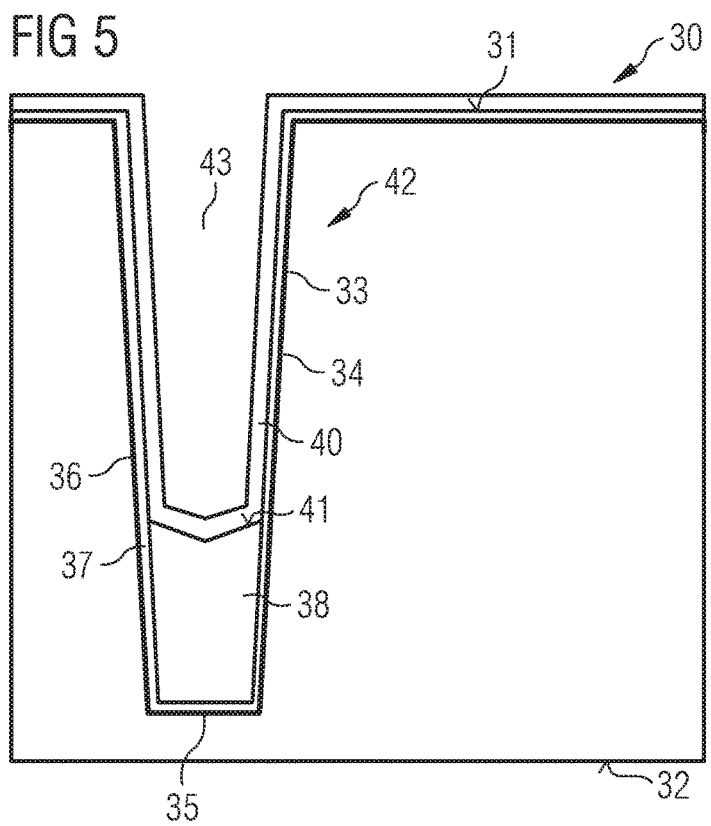

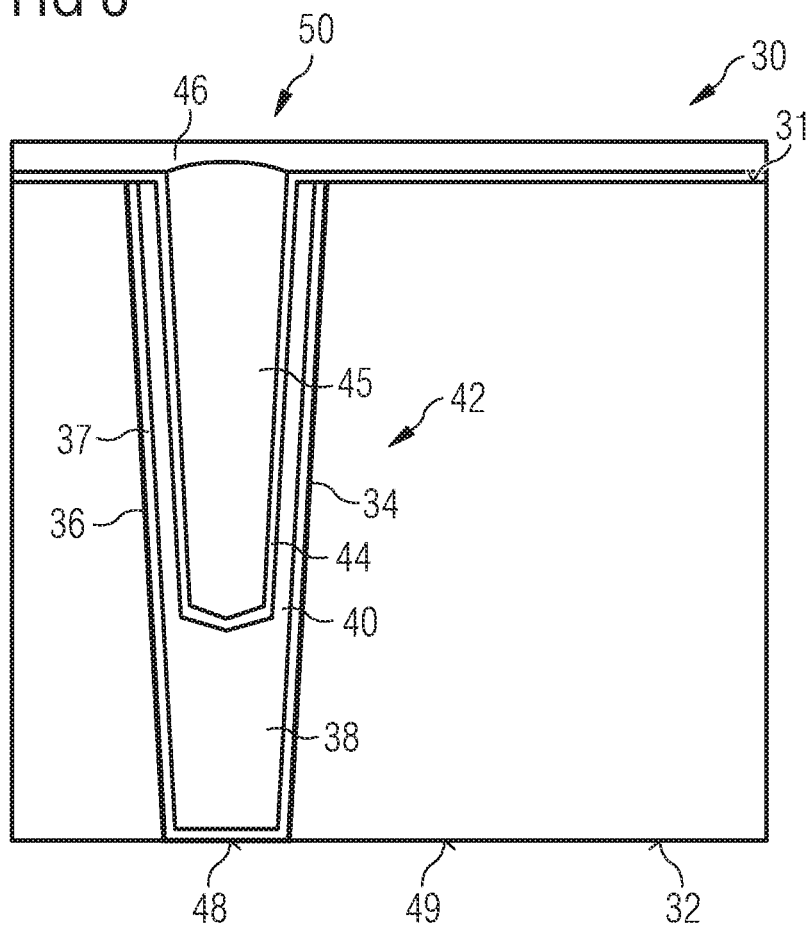

SUBSTRATE AND METHOD INCLUDING FORMING A VIA COMPRISING A CONDUCTIVE LINER LAYER AND CONDUCTIVE PLUG HAVING DIFFERENT MICROSTRUCTURES

BACKGROUND

In some semiconductor devices, a conductive through substrate via (TSV) is used to provide a conductive connection between two sides of semiconductor substrate. A TSV may be used to electrically couple a ground terminal of a device arranged at a first side of the semiconductor substrate to a ground plane arranged on the opposing side of the semiconductor substrate, for example. A TSV may also be used when stacking devices to electrically couple an upper device of the stack to an underlying device.

Methods for forming improved conductive through substrate vias would be desirable.

SUMMARY

In an embodiment, a substrate includes semiconductor material and a conductive via. The conductive via includes a via in the substrate, a conductive plug filling a first portion of the via and a conductive liner layer that lines side walls of a second portion of the via and is electrically coupled to the conductive plug. The conductive liner layer and the conductive plug have different microstructures.

In an embodiment, a method includes forming a first conductive layer in a first portion of an opening in a semiconductor substrate using first deposition parameters such that the first conductive layer fills the opening in the first portion and forming a second conductive layer on the first conductive layer in a second portion of the opening using second deposition parameters such that the second conductive layer bounds a gap in the second portion of the opening.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Exemplary embodiments are depicted in the drawings and are detailed in the description which follows.

FIG. 4 illustrates a cross-sectional view of a first conductive portion formed in the base of the blind via of FIG. 3.

FIG. 5 illustrates a cross-sectional view of a second conductive portion formed on the first conductive portion.

FIG. 8 illustrates the substrate after working of the rear surface of the substrate to expose the first conductive portion.

DETAILED DESCRIPTION

In the following detailed description, reference is made to the accompanying drawings, which form a part hereof, and in which is shown by way of illustration specific embodiments in which the invention may be practiced. In this regard, directional terminology, such as "top", "bottom", "front", "back", "leading", "trailing", etc., is used with reference to the orientation of the figure(s) being described. Because components of the embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, thereof, is not to be taken in a limiting sense, and the scope of the present invention is defined by the appended claims.

A number of exemplary embodiments will be explained below. In this case, identical structural features are identified by identical or similar reference symbols in the figures. In the context of the present description, "lateral" or "lateral direction" should be understood to mean a direction or extent that runs generally parallel to the lateral extent of a semiconductor material or semiconductor carrier. The lateral direction thus extends generally parallel to these surfaces or sides. In contrast thereto, the term "vertical" or "vertical direction" is understood to mean a direction that runs generally perpendicular to these surfaces or sides and thus to the lateral direction. The vertical direction therefore runs in the thickness direction of the semiconductor material or semiconductor carrier.

As employed in this specification, when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present.

As employed in this specification, when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Figure 1A:
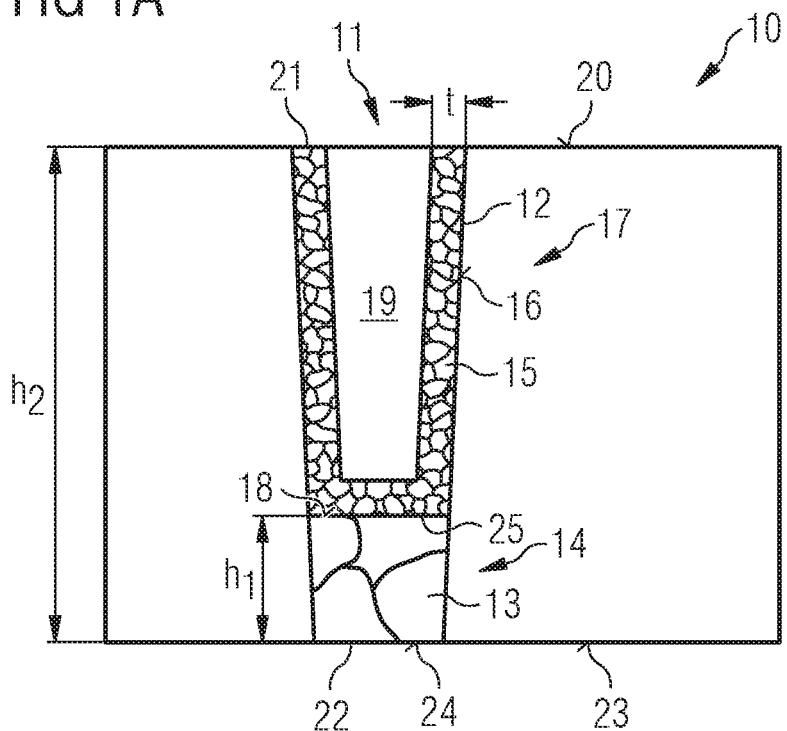
FIG. 1a illustrates a cross-sectional view of a conductive via in a substrate.
Figure 1B:
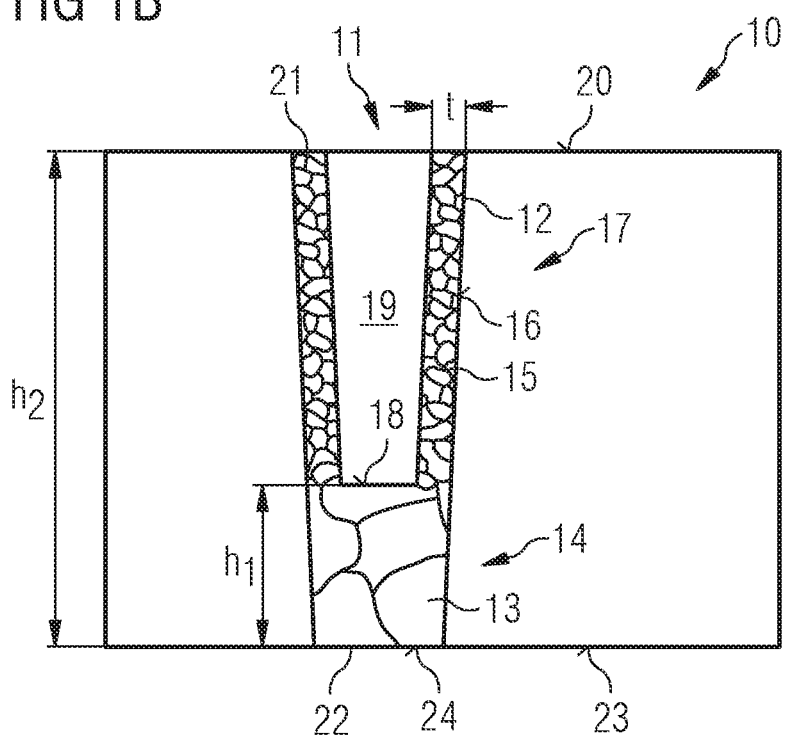
FIG. 1b illustrates a cross-sectional view of a conductive via in a substrate.
Figure 2:
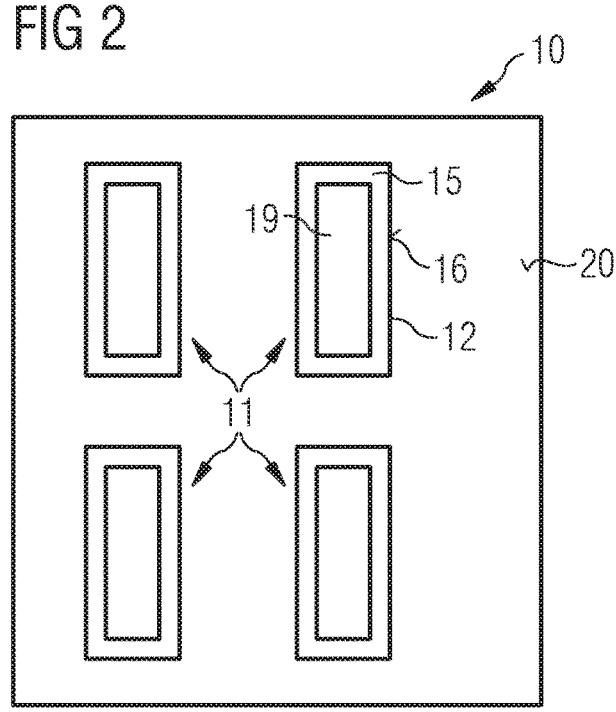
FIG. 2 illustrates a plan view of a plurality of conductive vias in a substrate.

FIGS. 1a and 1b illustrates a cross-sectional view of a portion of a substrate 10, and FIG. 2 illustrates a plan view of the substrate 10.

The substrate 10 includes at least one conductive via 11. The conductive via 11 includes a via 12 in the substrate 10, a conductive plug 13 filling a first portion 14 of the via 12 and a conductive liner layer 15 lining sidewalls 16 of a second portion 17 of the via 12. The conductive liner layer 15 is electrically coupled to the conductive plug 13. The conductive liner layer 15 and the conductive plug 13 may have different microstructures.

The via 12 has at least sidewalls formed by the material of the substrate 10 and may also be called a through-hole. The conductive plug 13 and the conductive liner layer 15 are positioned within the via 12 to provide a conductive via 11.

The conductive via 11 may be considered to be anisotropically filled as the conductive plug 13 fills the lateral area of the via 12, whereas the conductive liner layer 15 surrounds a gap 19 or void at the centre of the via 12. The anisotropic fill may be used to provide stress relief and simpler processing for a substrate at the wafer level and a substrate at the device level after singulation from the wafer.

For example, the positioning of gap 19 within the via 12 may be used to prevent bowing of the substrate, particularly during fabrication of arrays of conductive vias and may be used for stress compensation. The conductive via 11 may have improved thermal performance during thermal cycling, since the conductive material of the conductive plug 13 and conductive liner layer 15 can expand into the gap 19.

Furthermore, the use of the filled base of the conductive via 11 prevents solder from entering the via during die attach, for example when the second surface 23 is soldered onto a die pad or ground plane.

The conductive liner layer 15 and conductive plug 13 may have different microstructures. As an example, the conductive plug 13 may have a larger average grain size than an average grain size of the conductive liner layer 15. The differing microstructures and/or grain sizes may result from differing conditions used to deposit the conductive plug 13 and conductive liner layer 15 in the via 12.

In an embodiment, different electrochemical processing baths which include different chemical additive systems are used to deposit the conductive plug 13 and the conductive liner layer 15. The different chemical additive system may be selected to promote differing growth mechanisms resulting in different microstructures, such as average grain size. The chemical additive system may be identified in the final produce using analytical techniques, such as TOF-SIMS (Time-Of-Flight Secondary Ion Mass Spectrometry).

The conductive liner layer 15 and the conductive plug 13 may include the same material, for example the same metal. In some embodiments, the conductive liner layer 15 and the conductive plug 13 include high purity copper. The conductive plug 13 has a height $h_1$ which is greater than the thickness t of the conductive liner layer, for example, $h_1 \leq 3t$.

FIG. 1a illustrates a substrate 10 in which the conductive liner layer 15 and conductive plug 13 have different microstructures and an interface 25 is formed between them, in particular between the base of a U-shaped conductive liner layer 15 and an upper surface 18 of the conductive plug 13. The conductive liner layer 15 may be positioned directly on the upper surface 18 of the conductive plug 13 to form the interface 25 and to provide a continuous layer from the upper surface 18 of the conductive plug 13 to a first surface 20 of the substrate 10. This arrangement including an interface 25 between an upper surface 18 of the conductive plug 13 and the base of a U-shaped conductive liner layer 15 may be produced after deposition of the conductive liner layer 15 on the conductive plug 13. The conductive liner layer 15 may surround a gap 19 within the via 12 which is open at the first surface 20 of the substrate 10.

FIG. 1b illustrates a substrate 10 in which the substrate 10 is subjected to an annealing treatment during subsequent processing of the substrate 10 having an arrangement including an interface 25 between an upper surface 18 of the conductive plug 13 and the base of a U-shaped conductive liner layer 15. This subsequent annealing treatment can result in grain growth of the material of the conductive plug 13 and of the conductive liner layer 15 such that an interface is no longer discernible and a conductive liner layer 15 is formed on the side walls of the via 12 and at the periphery of an upper surface 18 of the conductive plug 13 which has a different microstructure from the conductive plug, for example a smaller grain size. In this embodiment, the central portion of the upper surface 18 of the conductive plug 13 forms the base of the gap 19.

In some embodiments, the conductive liner layer 15 extends onto regions of the first surface 20 adjacent the via 12.

The substrate 10 may include a semiconductor material such as a semiconductor wafer, for example a silicon wafer. In some embodiments, the substrate 10 is a single crystal silicon wafer. The substrate may also be a semiconductor substrate that supports a semiconductor device, such as a transistor device, which is formed in or on the semiconductor substrate.

In some embodiments, the substrate 10 may include an insulating material or a dielectric material. The substrate may provide an interposer onto which semiconductor devices are mounted. The substrate 10 may include a printed circuit board, sapphire, SiC, AlN or diamond, for example.

In some embodiments, such as those illustrated in FIGS. 1a, 1b and 2, the conductive via 11 is a through substrate via (TSV) having a first end 21 which is substantially coplanar with the first surface 20 and a second end 22 which is substantially coplanar with a second surface 23 of the substrate 10, the second surface 23 opposing the first surface 20. A lower surface 24 of the conductive plug 13 may be substantially coplanar with the second surface 23. The through substrate via may have a height $h_2$ and the conductive plug may have a height $h_1$ whereby $h_1$ may be less than the equal to $2h_2/3$, i.e. $h_1 \leq 2h_2/3$. As an example, 20 µm $\leq h_2 \leq$ 100 µm and 5 µm $\leq h_1 \leq$ 70 µm.

The gap 19 positioned within the upper portion 17 of the via 12 may be open at the upper surface 20. In some embodiments, the first end 21 of the conductive via 11 is sealed to produce a cavity within the upper portion 17 of the conductive via 11. The lateral area of the conductive vias 11 formed by the gap 19 or cavity, if present, may be between 0.5% and 4% of the total surface area of the substrate 10.

The via 12 and conductive via 12 may have different lateral forms, for example an elongate form, such as a rectangle, a circular or square or hexagonal lateral shape.

In some embodiments, two or more conductive vias 11 may be provided in a substrate 10.

In the plan view of FIG. 2, it can be seen that a plurality of conductive vias 11 may be provided and arranged in a regular array. Each conductive via 11 may have a substantially rectangular lateral form and may be called a trench. Two or more of the conductive vias 11 may be used to provide a single conductive connection, for example a ground connection.

In an embodiment, a method for fabricating a conductive via, such as the conductive via 11, in a substrate includes forming a first conductive layer in a first portion of an opening in a substrate using first deposition parameters such that the first conductive layer fills the opening in the first portion and forming a second conductive layer on the first conductive layer in a second portion of the opening using second deposition parameters such that second conductive layer surrounds a gap in the second portion.

As an example, the first conductive layer and the second conductive layer may be formed by electrodeposition techniques.

The first deposition parameters may be selected to favour the growth of the first conductive layer in the vertical direction with respect to a major surface of the substrate and suppress growth in lateral directions and on the front surface of the substrate. The second deposition parameters may be selected to favour growth of the second conductive layer in a lateral direction with respect to the major surface of the substrate. The first and second deposition parameters may be selected such that the first conductive layer has the form of a conductive plug having a height $h_1$ and the second conductive layer has a thickness $t$, whereby $h_1 \geq 3t$. As an example, 0.5 µm ≤ t ≤ 3 µm and 5 µm ≤ $h_1$ ≤ 70 µm.

The different favoured growth directions may be achieved by using a different electroplating chemistry for the deposition of the first conductive layer and the second conductive layer. For example, the chemical additive may be selected such that either growth in the vertical direction or in the horizontal direction with respect to a major surface of the substrate is favoured.

In some embodiments, the opening has the form of a blind via, or closed-end via, and the first conductive layer is applied to the base of the blind via such that the base portion of the blind via is filled with the first conductive layer. In some embodiments, the blind via is filled to a depth of 10% to 70% of the total depth of the blind via. In order to provide a conductive path between the front surface and the rear surface of the final substrate, the rear surface adjacent the blind via may be worked to move material until a portion of the conductive plug is exposed and the substrate has the desired thickness.

A method for fabricating a conductive via will now be described with reference to FIGS. 3 to 8.

Figure 3:
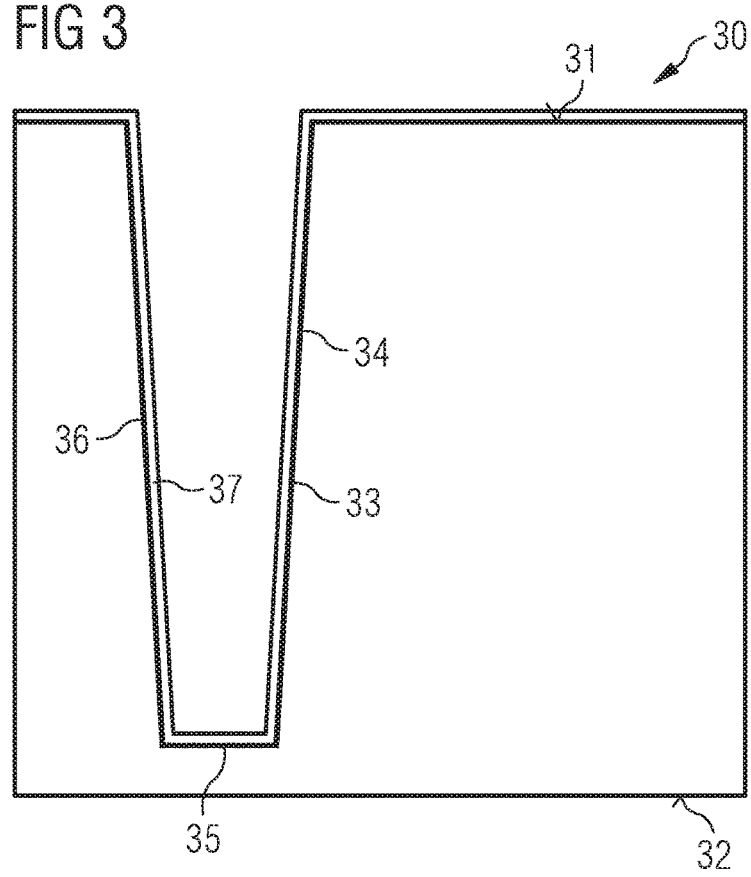
FIG. 3 illustrates a cross-sectional view of a substrate including a blind via.

FIG. 3 illustrates a substrate 30 having a first major surface 31 and a second major surface 32 which opposes the first major surface 31. The substrate 30 may be a semiconductor substrate, for example a silicon wafer. A blind or closed-end via 33 is inserted into the first major surface 31 of the substrate 30. The blind via 33 may be formed by etching the first major surface 31, for example by using reactive ion etching.

The blind via 30 may have a laterally elongate shape and may be substantially rectangular in plan view. The sidewalls 34 of the blind via 33 may have an angle of around 87° to the first major surface 31 such that the top of the blind via 33 is laterally slightly larger than the base 35 of the blind via 33. The blind via 33 may have a depth of around 60 µm and a width of 8 µm and breadth of 50 µm at the first major surface 31. In other embodiments, the side walls 34 of the blind via 33 may extend substantially perpendicular to the first major surface 31.

A barrier layer 36 may be deposited on the side walls 44 and base 35 of the blind via 33 and a seed layer 37 on the barrier layer 36. For a silicon substrate 31 and a conductive material of high purity copper, the barrier layer 36 may include a tantalum layer having a thickness of around 20 nm and the seed layer 37 may include high purity copper with a thickness of around 300 nm. The barrier layer 36 and the seed layer 37 may be deposited by Physical Vapour Deposition (PVD) techniques, such as sputtering. However, the arrangement is not limited to one including a barrier layer and a seed layer. For example, one layer or more than two layers may be deposited between the sidewalls 44 and base 35 of the blind via 33 and the conductive material inserted into the blind via 33.

FIG. 4 illustrates the formation of a first conductive portion 38 formed at the base 35 of the blind via 33 on the seed layer 37. The first conductive portion 38 may include high purity copper. The first conductive portion 38 fills the base of the blind via 33 and may be deposited, for example by electroplating, using an electroplating bath and deposition conditions which favour vertical growth, indicated in FIG. 4 by the arrow 39, to enable the deposited material to fill the lateral area of the blind via 33 at the base 35. The height of the first conductive portion 38 may be around 15 µm, for example. The first conductive portion 38 may be called a plug as it fills the lateral area of the blind via 33.

FIG. 5 illustrates the deposition of a substantially conformal conductive layer 40 onto the copper seed layer 37 arranged on the sidewalls 34 in an upper portion 42 of the blind via 33 above the first portion 38. The conductive layer 40 may be substantially conformally deposited on both the sidewalls 34 of the blind via 33, the upper surface 41 of the first conductive portion 38 and on the front surface 31 of the substrate 30. The conductive layer 40 may be deposited using an electroplating technique. The electroplating bath and deposition conditions are selected to favour conformal deposition such that the conductive layer 40 deposited into the upper portion 42 of the blind via 33 surrounds a gap 43 in the upper portion 42 of the blind via 33 above the first conductive portion 38. The conductive layer 40 may have a thickness of between 1 µm and 5 µm.

Figure 6:
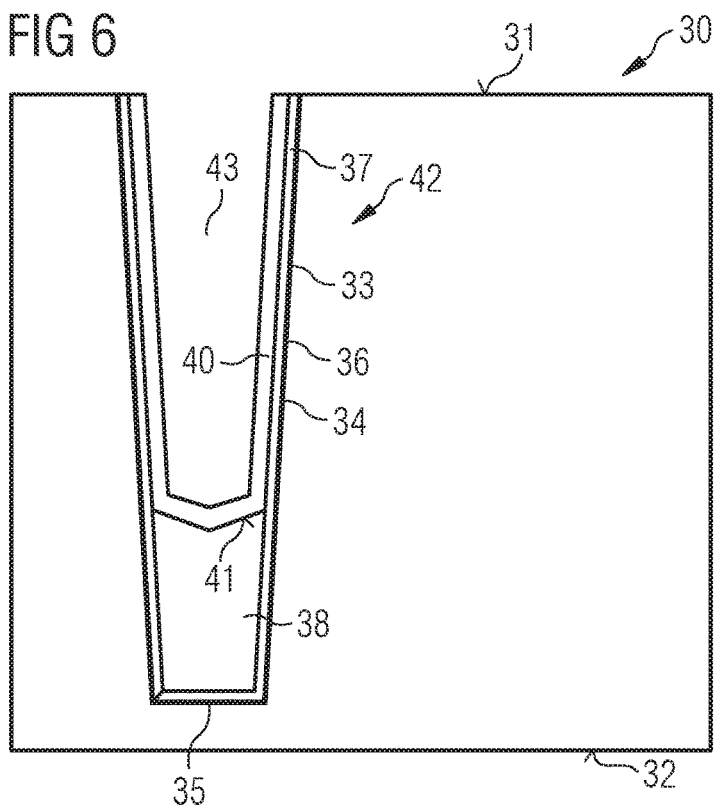
FIG. 6 illustrates a cross-sectional view of the substrate of FIG. 5 after a planarization process.

In some embodiments, the conductive layer 40, the seed layer 37 and the barrier layer 36 may subsequently be removed from the first major surface 31, for example by Chemical Mechanical Polishing (CMP), as illustrated in FIG. 6. In other embodiments, these layers may remain on the first major surface 31.

Figure 7:
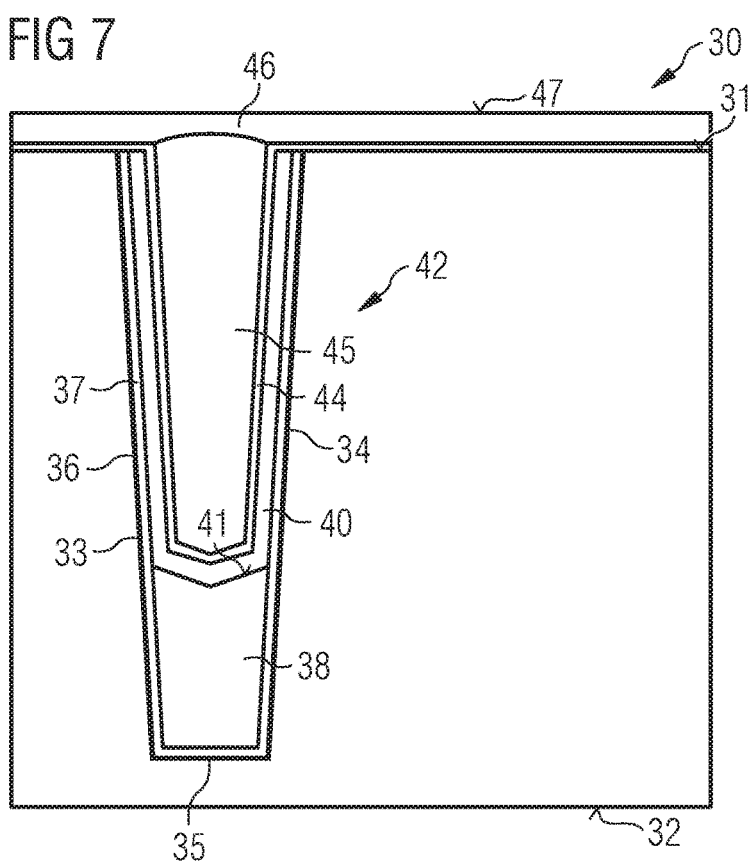
FIG. 7 illustrates the blind via after formation of a cavity within the blind via.

FIG. 7 illustrates an embodiment in which a cavity or void is formed within the upper portion 42 of the blind via 33. A first insulating layer 44 may be deposited which covers the surface of the conductive layer 40 and the first major surface 31 of the substrate 30, as is illustrated in FIG. 7. The first insulating layer 44 may be a passivation layer, for example silicon nitride, and have a thickness of around 100 nm. The first insulating layer 44 surrounds a gap or void within the upper portion of the blind via 33.

In order to form a cavity 45 within the blind via 33, a second insulating layer 46, for example an oxide, may be applied to the first major surface 31 using non-conformal techniques so that the oxide layer 46 fills the uppermost portion of the blind via 33 non-conformally to seal the opening and extends onto at least upper portions of the first insulating layer 44, thus leaving a void or cavity 45 within the blind via 33. The dielectric layer 46 may include silicon oxide, $SiO_x$, deposited using PE CVD (Plasma Enhanced Chemical Vapour Deposition). The sealed or enclosed cavity 45 is defined on all sides by the dielectric material of the first insulating layer 45 or the second insulating layer 46. A further planarization process, for example by using chemical mechanical polishing may be used to planarise the upper surface 47 of the oxide layer 46.

As is illustrated in FIG. 8, the second major surface 32 of the substrate 30 may be worked to remove the portion of the substrate 30 underneath the base 35 of the blind via 33 such that a surface 48 of the first conductive portion 38 is exposed within the worked second major surface 49 of the substrate 30. The overall thickness of the substrate 30 may be reduced to around 60 µm.

The conductive material provided by the first conductive portion 38 and the conductive layer 40 provides a conductive through substrate via 50 which extends throughout the thickness of the substrate 30. The conductive through substrate via 50 can be considered to be partially filled, since the upper portion includes the cavity 45 and the lower portion is filled with the first conductive portion 38.

The positioning of the cavity 45 within the conductive through substrate via 50 may be used to prevent bowing of the substrate during fabrication of arrays of conductive vias and may be used for stress compensation. The conductive through substrate via 50 may have improved thermal performance during thermal cycling, since the conductive material of the first conductive portion 38 and conductive layer 40 can expand into the cavity 45. Furthermore, the use of the filled base of the conductive through substrate via 50 prevents solder form entering the via during die attach, for example when the rear surface 48 is soldered onto a die pad or ground plane.

The conductive through substrate via according to one or more of the embodiments described herein may be used to provide a conductive connection between two sides of semiconductor substrate. The conductive through substrate via according to one or more of the embodiments described herein may be used to electrically couple a ground terminal of a device arranged at a first side of the semiconductor substrate to a ground plane arranged on the opposing side of the semiconductor substrate, or to electrically couple an upper device of the stack to an underlying device, for example.

The use of a partially filled conductive via according to one of the embodiments described herein may be used to provide a conductive via that is less sensitive to stress, since the upper portion of the via includes a cavity, and which is also compatible with processing techniques for thin wafers, since the lower part of the conductive via is filled with copper.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise. It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method, comprising:
forming a first conductive layer in a first portion of an opening in a semiconductor substrate using first deposition parameters such that the first conductive layer fills the opening in the first portion; and
forming a second conductive layer on the first conductive layer in a second portion of the opening using second deposition parameters such that the second conductive layer bounds a first gap in the second portion,
wherein the first deposition parameters are selected to favour growth of the first conductive layer in a vertical direction with respect to a major surface of the semiconductor substrate and suppress growth in lateral directions and on a front surface of the semiconductor substrate,
wherein the second deposition parameters are selected to favour conformal growth of the second conductive layer in a lateral direction with respect to the major surface of the semiconductor substrate,
wherein the first conductive layer and the second conductive layer are formed by electroplating.

2. The method of claim 1, further comprising forming the second conductive layer on a first surface of the semiconductor substrate surrounding the opening.

3. The method of claim 1, wherein the first conductive layer is applied to abase of a blind via and the base of the blind via is filled with the first conductive layer.

4. The method of claim 3, wherein the blind via is filled to a depth of 10% to 70% of a total depth of the blind via.

5. The method of claim 3, further comprising:
working a second surface of the semiconductor substrate; and
exposing a portion of the first conductive layer in the second surface of the substrate.

6. The method of claim 1, further comprising:
forming a first insulating layer over the second conductive layer that surrounds a second gap; and
forming a second insulating layer over the second gap so as to form an enclosed cavity within the opening.

7. The method of claim 1, wherein the first deposition parameters and the second deposition parameters are selected such that the first conductive layer forms a conductive plug with a height $h_1$ and the second conductive layer has a thickness t whereby $h_1 \geq 3t$.

8. The method of claim 7, wherein $0.5\ \mu m \leq t \leq 3\ \mu m$ and wherein $5\ \mu m \leq h_1 \leq 70\ \mu m$.

9. The method of claim 1, wherein a different electroplating chemistry is used for the deposition of the first conductive layer and the second conductive layer.

10. The method of claim 1, wherein the first conductive layer is in direct contact with the second conductive layer.

* * * * *

UNITED STATES PATENT AND TRADEMARK OFFICE
CERTIFICATE OF CORRECTION

PATENT NO. : 9,875,933 B2  
APPLICATION NO. : 15/192146  
DATED : January 23, 2018  
INVENTOR(S) : Birner et al.

Page 1 of 1

It is certified that error appears in the above-identified patent and that said Letters Patent is hereby corrected as shown below:

In the Claims

Column 8, Line 28 (Claim 3, Line 2), please change "abase" to --a base--.

Signed and Sealed this  
Third Day of April, 2018

Andrei Iancu  
*Director of the United States Patent and Trademark Office*